United States Patent
Cheng et al.

(10) Patent No.: US 10,510,589 B2
(45) Date of Patent: Dec. 17, 2019

(54) CYCLIC CONFORMAL DEPOSITION/ANNEAL/ETCH FOR SI GAPFILL

(71) Applicant: Applied Materials, Inc., Santa Clara, CA (US)

(72) Inventors: Rui Cheng, San Jose, CA (US); Yi Yang, San Jose, CA (US); Abhijit Basu Mallick, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/991,376

(22) Filed: May 29, 2018

(65) Prior Publication Data
US 2019/0019724 A1    Jan. 17, 2019

Related U.S. Application Data

(60) Provisional application No. 62/531,598, filed on Jul. 12, 2017.

(51) Int. Cl.
*H01L 21/768* (2006.01)
*H01L 21/02* (2006.01)
(Continued)

(52) U.S. Cl.
CPC .... *H01L 21/76837* (2013.01); *H01L 21/0228* (2013.01); *H01L 21/0243* (2013.01);
(Continued)

(58) Field of Classification Search
CPC ........... H01L 21/02532; H01L 21/0257; H01L 21/02573; H01L 21/02576; H01L 21/02579; H01L 21/02592; H01L 21/0262; H01L 21/02656; H01L 21/32055; H01L 21/32135; H01L 21/32137; H01L 21/32155; H01L 21/3247; H01L 21/47635; H01L 21/76877; H01L 21/76879; H01L 21/76882; H01L 21/76883
See application file for complete search history.

(56) References Cited

U.S. PATENT DOCUMENTS 7,157,327 B2   1/2007 Haupt
9,425,073 B2   8/2016 Onodera et al.
(Continued)

OTHER PUBLICATIONS

International Search Report and Written Opinion dated Sep. 19, 2018 for Application No. PCT/US2018/034877.

*Primary Examiner* — Stephen W Smoot
(74) *Attorney, Agent, or Firm* — Patterson + Sheridan LLP

(57) ABSTRACT

Methods for seam and void-free gapfilling, such as gapfilling high aspect ratio trenches with amorphous silicon, are provided. A method generally includes depositing amorphous silicon over a semiconductor device having one or more features thereon, annealing the deposited amorphous silicon to heal one or more seams in the deposited amorphous silicon between the one or more features, and etching the annealed amorphous silicon to remove one or more voids in the annealed amorphous silicon between the one or more features. The deposition, anneal, and etch processes are generally repeated any suitable number of times to achieve amorphous silicon gapfill without any seam or void between the one or more features.

20 Claims, 4 Drawing Sheets

(51) Int. Cl.
  *H01L 21/3215* (2006.01)
  *H01L 21/3205* (2006.01)
  *H01L 21/3213* (2006.01)
  *H01L 21/324* (2006.01)

(52) U.S. Cl.
  CPC .... *H01L 21/0262* (2013.01); *H01L 21/02274* (2013.01); *H01L 21/02532* (2013.01); *H01L 21/02576* (2013.01); *H01L 21/02579* (2013.01); *H01L 21/02592* (2013.01); *H01L 21/02664* (2013.01); *H01L 21/3247* (2013.01); *H01L 21/32055* (2013.01); *H01L 21/32137* (2013.01); *H01L 21/32155* (2013.01); *H01L 21/76883* (2013.01)

(56) References Cited

U.S. PATENT DOCUMENTS

| | | |
|---|---|---|
| 2003/0143852 A1 | 7/2003 | En-Ho et al. |
| 2003/0203596 A1 | 10/2003 | Ho et al. |
| 2009/0286381 A1 | 11/2009 | van Schravendijk et al. |
| 2015/0011091 A1 | 1/2015 | Takenaga et al. |
| 2015/0194385 A1 | 7/2015 | McFeely et al. |
| 2017/0253989 A1* | 9/2017 | Chiba ................ C23C 16/06 |
| 2017/0287778 A1* | 10/2017 | Okada ............ H01L 21/76882 |
| 2019/0172723 A1* | 6/2019 | Cheng ............ H01L 21/32137 |

* cited by examiner

CYCLIC CONFORMAL DEPOSITION/ANNEAL/ETCH FOR SI GAPFILL

CROSS-REFERENCE TO RELATED APPLICATIONS

This application claims benefit of U.S. Provisional Patent Application Ser. No. 62/531,598, filed on Jul. 12, 2017, which is herein incorporated by reference in its entirety.

BACKGROUND

Field

Embodiments of the present disclosure generally relate to semiconductor manufacturing processes, and more particularly, to methods for gapfilling high aspect ratio trenches of semiconductor devices with amorphous silicon film, and to form seam or void-free semiconductor devices.

Description of the Related Art

For many semiconductor device manufacturing processes, there is a need to fill narrow trenches having high aspect ratios greater than, for example, 10:1. One example of such a process is shallow trench isolation (STI) in which the film needs to be of high quality and have very low leakage throughout the trench. As the dimensions of semiconductor device structures continue to decrease and the aspect ratios increase, post-curing processes become increasingly difficult and result in films with varying composition throughout the filled trench.

Conventionally, amorphous silicon (a-Si) has been used in semiconductor manufacturing processes since a-Si generally provides good etch selectivity with respect to other films, such as silicon oxide (SiO) and amorphous carbon (a-C). The conventional a-Si deposition methods, such as plasma-enhanced chemical vapor deposition (PECVD) and conformal deposition, however, cannot be used to gapfill high aspect ratio trenches. the deposition rate of conventional a-Si deposition methods is generally higher towards the top of the trenches and lower towards the bottom of the trenches, and seams are formed between the high aspect ratio trenches because of the uneven deposition rates. The seams are further opened up during post-curing processes and ultimately cause decreased throughput or even semiconductor device failure. Seams have conventionally been healed by thermal annealing. However, the thermal annealing generally causes shrinking of the deposited film and forms voids inside of the trenches.

Therefore, there is a need for methods for gapfilling high aspect ratio trenches of semiconductor devices that can provide seam and void-free film growth.

SUMMARY

Methods for seam and void-free gapfilling, such as gapfilling high aspect ratio trenches with amorphous silicon, are provided. A method generally includes depositing amorphous silicon over a semiconductor device having one or more features thereon, annealing the deposited amorphous silicon to heal one or more seams in the deposited amorphous silicon between the one or more features, and etching the annealed amorphous silicon to remove one or more voids in the annealed amorphous silicon between the one or more features. The deposition, anneal, and etch processes are generally repeated any suitable number of times to achieve amorphous silicon gapfill without any seam or void between the one or more features.

In one embodiment, a method for manufacturing a semiconductor device is disclosed. The method includes positioning a substrate having one or more features formed in a surface of the substrate, each of the one or more features having sidewalls and a bottom surface, in a process chamber, depositing an amorphous silicon film over the substrate having one or more features, annealing the amorphous silicon film, and etching a portion of the amorphous silicon film.

In another embodiment, a method for manufacturing a semiconductor device is disclosed. The method includes positioning a substrate having one or more high aspect ratio trenches formed in a surface of the substrate, each of the one or more high aspect ratio trenches having sidewalls and a bottom surface, in a process chamber, depositing an amorphous silicon film in the one or more high aspect ratio trenches, annealing the amorphous silicon film to heal one or more seams formed in the one or more high aspect ratio trenches, and etching the amorphous silicon film to a distance below a top surface of the substrate, the distance being equal to a distance between the top surface of the substrate and the bottom of the lowermost of one or more voids in the one or more features.

In yet another embodiment, a method for manufacturing a semiconductor device is disclosed. The method includes positioning a substrate having one or more features formed in a surface of the substrate, each of the one or more features having sidewalls and a bottom surface, in a first chamber, depositing a material over the substrate having one or more features in the first chamber, annealing the material in the first chamber to heal one or more seams in the material, transferring the substrate having one or more features to a second chamber, and etching a portion of the annealed material to remove one or more voids in the annealed material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Methods for seam and void-free gapfilling, such as gapfilling high aspect ratio trenches with amorphous silicon, are provided. A method generally includes depositing amorphous silicon over a semiconductor device having one or more features thereon, annealing the deposited amorphous silicon to heal one or more seams in the deposited amorphous silicon between the one or more features, and etching the annealed amorphous silicon to remove one or more voids in the annealed amorphous silicon between the one or more features. The deposition, anneal, and etch processes are generally repeated any suitable number of times to achieve amorphous silicon gapfill without any seam or void between the one or more features.

The description that follows will refer to gapfilling high aspect ratio trenches formed on a substrate with amorphous silicon as an example. However, the methods described herein are generally useful to gapfill any device features with any material or to remove seams and/or voids from a deposited material. Generally, "feature" means any intentional surface irregularity. Features generally have any suitable shape, including, but not limited to, vias, trenches, lines, contact holes, through-holes or other feature definitions utilized in semiconductor, solar, or other electronic devices, such as high ratio contact plugs.

Trenches, which are used as an example herein, generally have a top and two sidewalls and are formed between peaks, which generally have a top and two sidewalls. Features can be of any suitable aspect ratio, which is the ratio of the depth of the feature to the width of the feature. In some examples, a high aspect ratio trench is a trench having an aspect ratio greater than or equal to about 5:1, 10:1, 15:1, 25:1, 30:1, 35:1, or 40:1.

Figure 1:
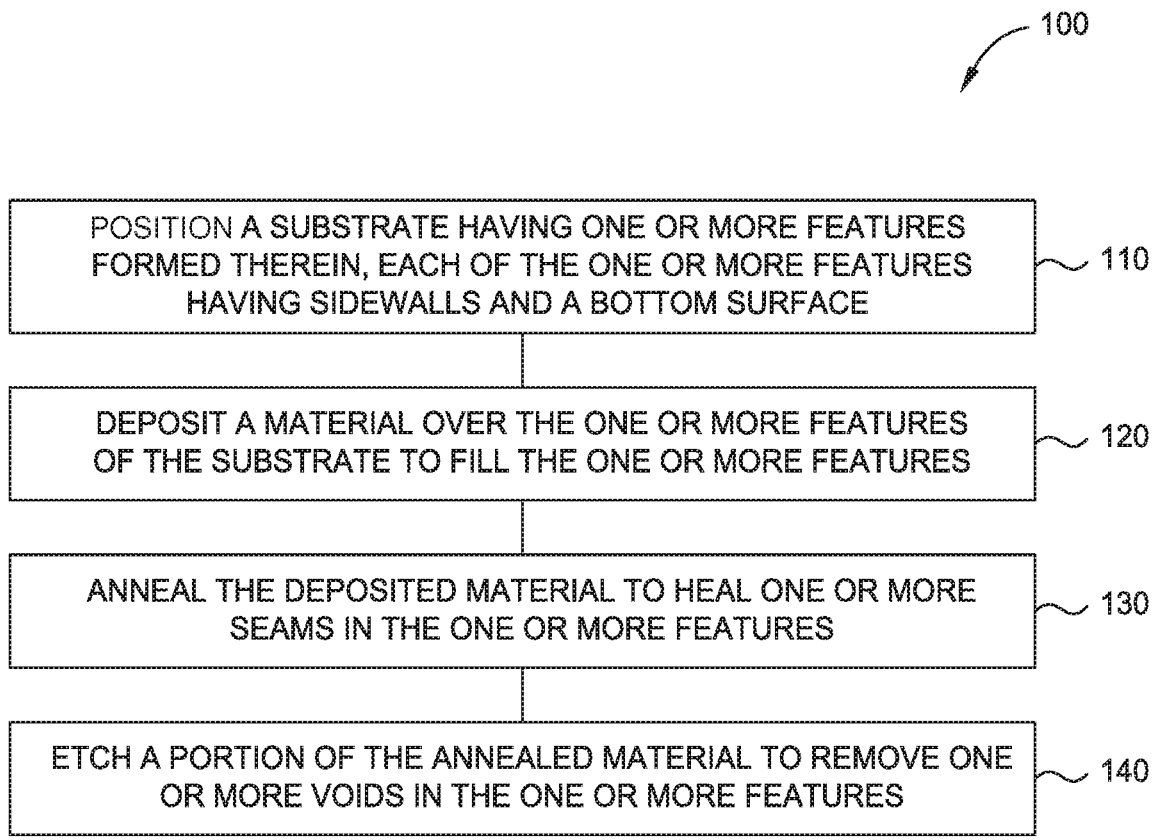
FIG. 1 is a flow diagram summarizing a method according to embodiments of the present disclosure.

FIG. 1 is a flow diagram summarizing a method 100 for gapfilling device features with amorphous silicon film according to embodiments of the present disclosure. FIGS. 2A-2E depict stages of fabrication of a semiconductor device 200 according to embodiments of the present disclosure, for example, in accordance with the method 100. Therefore, as an example, the method 100 is described below in accordance with the stages of gapfilling high aspect ratio trenches of a semiconductor device 200 with amorphous silicon film as illustrated in FIGS. 2A-2E.

Figure 2A:
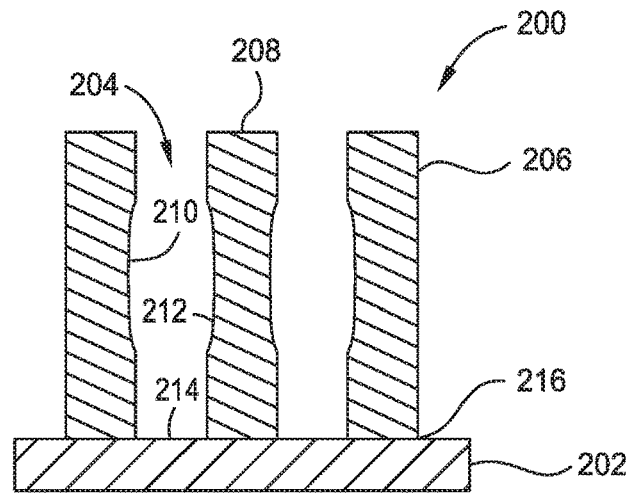
FIGS. 2A-2E depict stages of fabrication of a semiconductor device according to embodiments of the present disclosure.

Method 100 begins at operation 110 by positioning a substrate 202 having one or more features 204 (shown as two high aspect ratio trenches) formed in a layer 206, such as a silicon or carbon-containing layer, on the substrate 202, as shown in FIG. 2A, into a position or environment, such as a process chamber, for further processing. The substrate 202 is generally any suitable substrate for processing, including but not limited to, silicon (Si) and/or germanium (Ge) substrates, and may include other elements such as, oxygen (O), nitrogen (N), and carbon (C).

As shown in FIG. 2A, the one or more features 204 generally include a first sidewall 210, a second sidewall 212, and a bottom 214. The first sidewall 210 and the second sidewall 212 define the width (W) of the one or more features 204. A height (H) of the one or more features is generally from a top surface 208 of the layer 206 to a bottom surface 216 of the layer 206. While FIG. 2A shows two features, the present disclosure further contemplates that the substrate 202 can have one or more than one feature 204.

Figure 2B:
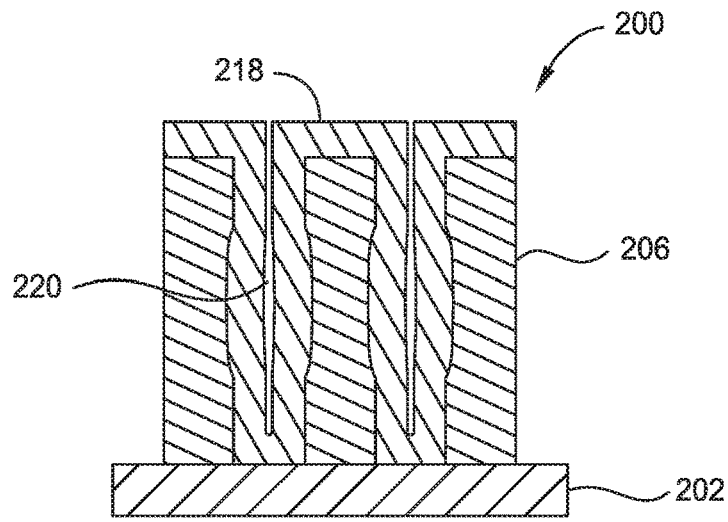

At operation 120, a material 218 is deposited over the one or more features 204 of the substrate 202 to fill the one or more features 204, as shown in FIG. 2B. The material 218 is generally deposited by any suitable deposition process. Examples of suitable deposition processes include, but are not limited to, chemical vapor deposition (CVD), plasma-enhanced CVD (PECVD, atomic layer deposition (ALD), and plasma-enhanced ALD (PEALD). In one example, the material 218 is deposited by thermal CVD.

In one embodiment, the material 218 is an amorphous silicon film and depositing the material 218 includes exposing the one or more features 204 of the substrate 202 to a silicon precursor. Examples of suitable silicon precursors include, but are not limited to, one or more of silane ($SiH_4$), disilane ($H_6Si_2$), dichlorosilane (DCS), trisilane ($H_8Si_3$), and tetrasilane ($Si_4H_{10}$). The silicon precursor is optionally heated in a hot can to increase the vapor pressure and then delivered to the process chamber for deposition using ultra-high purity (UHP) argon (Ar) carrier gas. Other suitable carrier gasses, which are generally co-introduced with the silicon precursor include, but are not limited to, helium (He) and hydrogen gas ($H_2$).

In another embodiment, the material 218 is a doped amorphous silicon film deposited by exposing the one or more features 204 of the substrate 202 to a doping precursor in addition to the silicon precursor. By doping the amorphous silicon, the temperature for subsequent processing operations, such as etching of the doped a-Si layer, is generally reduced. Examples of dopants include, but are not limited to, boron (B), phosphorous (P), gallium (Ga), Sn (Tin), arsenic (As), germanium (Ge), carbon (C), nitrogen (N), and antimony (Sb). Examples of suitable doping precursors include, but are not limited to, dimethylamine borane [NH(CH3)2BH3] (DMAB), diborane ($B_2H_6$), germane ($GeH_4$), and phosphane ($PH_3$).

Depositing the material 218 over the one or more features 204 of the substrate 202 generally occurs at a temperature between about 150 degrees Celsius (° C.) and about 500° C. The deposition can be performed with or without capacitively coupled plasma (CCP) or inductively coupled remote plasma (ICP). During the deposition process, a pressure in the process chamber is generally between about 100 mTorr and about 350 Torr.

As discussed above, one or more seams 220 are generally formed in the one or more features 204 during the deposition of the material 218. If left untreated, the one or more seams 220 often open up during further processing of the semiconductor device 200, which leads to defective device performance.

At operation 130, the deposited material 218 is annealed to heal the one or more seams 220. In one embodiment, the material 218 is annealed by an in-situ thermal anneal process. The temperature during the anneal operation is generally between about 400° C. and about 1,100° C. The anneal process may be performed over any suitable amount of time, for example, for between about 0.1 seconds and about 5 hours. A gas ambient for the anneal process generally includes one or more of $H_2$, Ar, He, and nitrogen gas ($N_2$). A process chamber pressure generally ranges between about 100 mTorr and about 1 atmosphere (atm) during the annealing.

In another embodiment, the one or more seams 220 are healed with a plasma treatment. In yet another embodiment, the one or more seams 220 are healed with an e-beam treatment. In further embodiments, the one or more seams 220 are healed with any suitable process to reflow silicon (Si) atoms of the amorphous silicon.

Figure 2C:
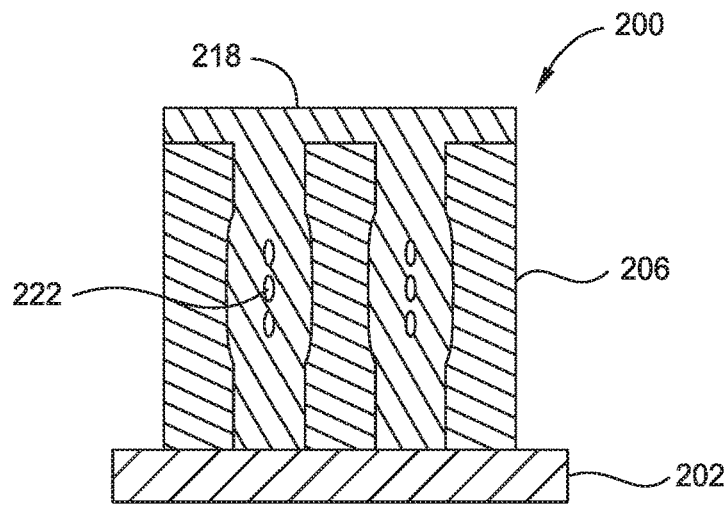

Generally, one or more voids 222 (three are shown as an example) form in the material 218 during the anneal process, as shown in FIG. 2C. For example, any surface tensions of the substrate 202 or the layer 206 often result in the formation of the one or more voids 222 in the material 218. Like the one or more seams 220, if the one or more voids 222 are not partially or completely removed, the performance of the semiconductor device 200 is generally negatively affected.

Figure 2D:
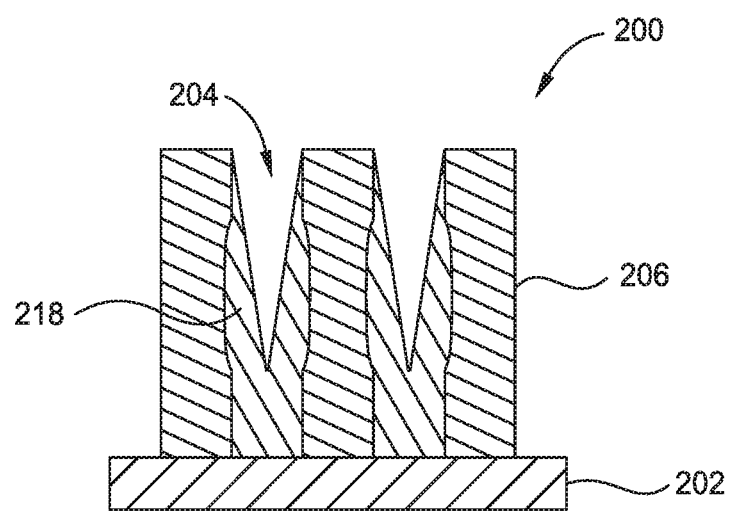

At operation 140, at least a portion of the annealed material 218 is etched to remove the one or more voids 222, as shown in FIG. 2D. In one embodiment, etching a portion of the annealed material 218 includes exposing the material 218 on the one or more features 204 of the substrate 202 to an etchant. The material 218 is etched down into the one or more features 204 a distance below the top surface 208 of the layer 206 of the substrate 202, the distance being equal to a distance between the top surface 208 and the bottom of the lowermost of one or more voids 222 in the one or more features 204. By etching a portion of the material 218 to a distance equal to or below the bottom of the lowermost of the one or more voids 222, the one or more voids 222 are removed prior to subsequent deposition of additional material 218 or another material.

The etch process is generally any suitable etch process, including, but not limited to, thermal etching or plasma etching with a capacitively coupled plasma (CCP) or an inductively coupled plasma (ICP). Examples of suitable etchants include, but are not limited to, one or more of nitrogen trifluoride ($NF_3$), chlorine gas ($Cl_2$), hydrochloric acid (HCl), hydrogen bromide (HBr), hexafluoro-2-butyne ($C_4F_6$), tetrafluoroethylene ($C_2F_4$), $H_2$, Ar, He, and $N_2$.

Figure 2E:
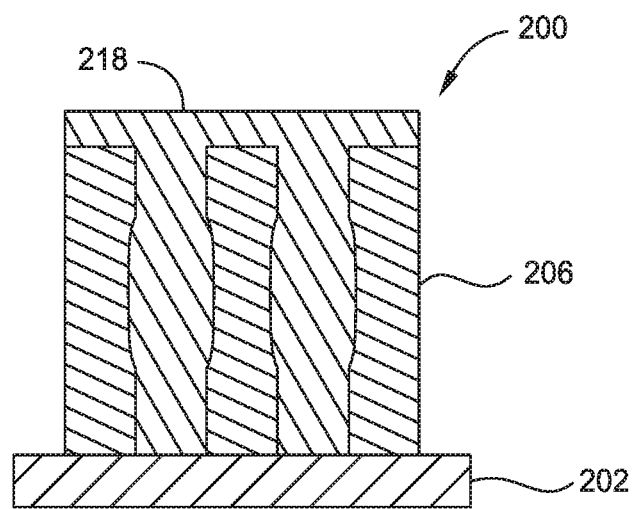

Operation 120, operation 130, and operation 140 are generally repeated any suitable number of times to fill the one or more features 204 with material 218 without any, or with reduced, seams or voids, as shown in FIG. 2E.

Figure 3:
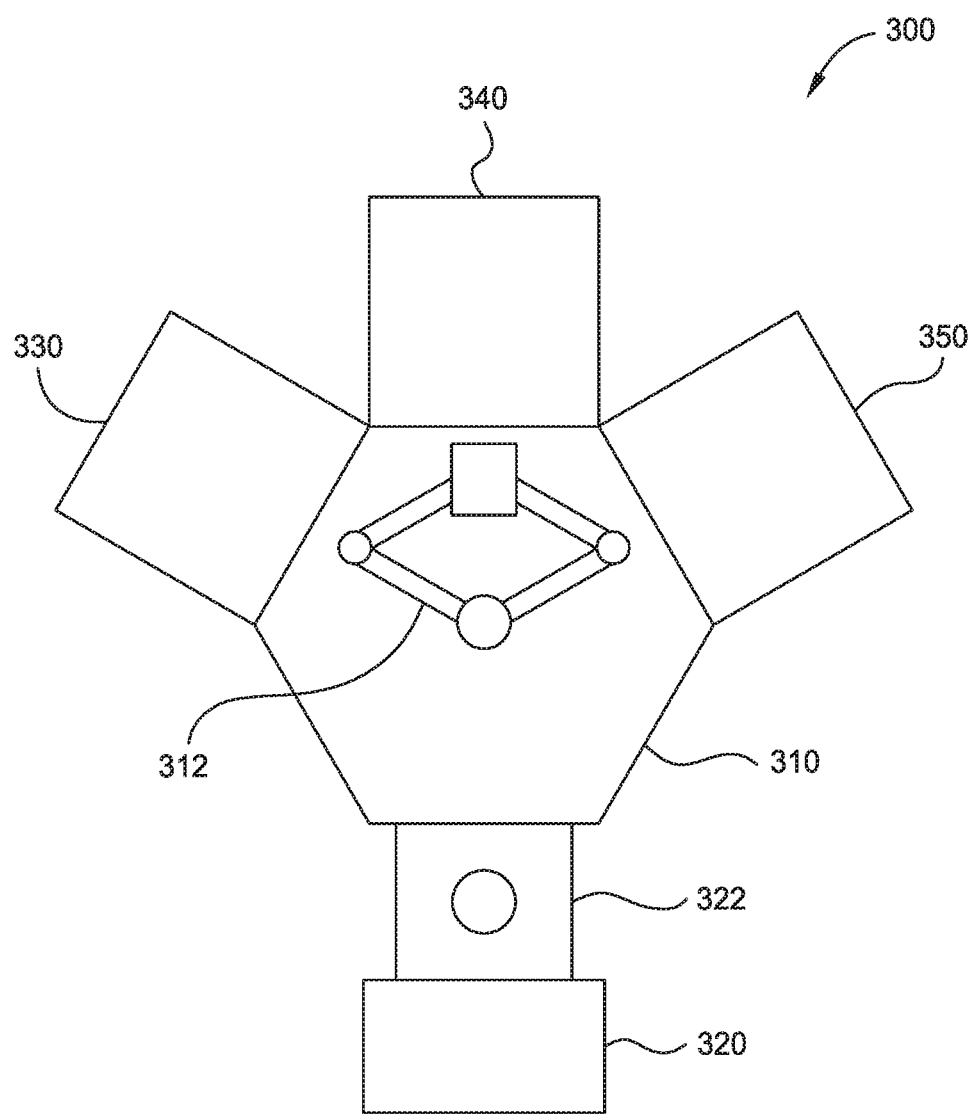
FIG. 3 is a schematic view of an apparatus for performing a method according to embodiments of the present disclosure.

FIG. 3 is a schematic view of an apparatus 300 for performing a method according to embodiments described herein. More specifically, the apparatus 300 is a cluster tool for fabricating semiconductor devices according to the methods described above. At the center of the apparatus 300 is a transfer chamber 310. Within the transfer chamber 310 is a substrate transferring mechanism 312. The substrate transferring mechanism 312 transfers a substrate from one of the first, second, or third process chambers, 330, 340, and 350, respectively, to the load lock chamber 320 and vice versa. The first, second, and third process chambers, 330, 340, and 350, are connected to the transfer chamber 310. The load lock chamber 320 is connected to the transfer chamber 310 through a substrate alignment chamber 322. As illustrated in FIG. 3, the apparatus 300 includes three process chambers. However, the apparatus 300 generally includes any suitable number of chambers.

In one embodiment, the first process chamber 330 is a deposition chamber, the second process chamber 340 is a chamber suitable for performing annealing processes, and the third process chamber 350 is an etch chamber. Suitable chambers include chambers available from Applied Materials, Inc. of Santa Clara, Calif., such as PRODUCER® chambers and VANTAGE® chambers. Operation 120 generally occurs in the first process chamber 330. In one embodiment, the substrate 202 remains in the first process chamber 330 for the annealing process at operation 130. In another embodiment, the substrate 202 is transferred to the second process chamber 340 for the annealing process at operation 130. The substrate 202 is generally then transferred to the third process chamber 350 for the etching process at operation 140.

Process chamber for performing operations disclosed herein are available from Applied Materials, Inc., of Santa Clara, Calif. However, it is contemplated that other process chambers, including those from other manufacturers, may also be used and may benefit from aspects of the disclosure.

Embodiments of the present disclosure provide seam and void-free gapfill for semiconductor device features, such as amorphous silicon gapfill for high aspect ratio trenches. Since the gapfill is seam and void-free, or includes a reduced number of seams and voids, the overall performance of the semiconductor device is improved.

While the foregoing is directed to embodiments of the present disclosure, other and further embodiments of the disclosure may be devised without departing from the basic scope thereof, and the scope thereof is determined by the claims that follow.

What is claimed is:

1. A method for manufacturing a semiconductor device, comprising:
    positioning a substrate having one or more features formed in a surface of the substrate, each of the one or more features having sidewalls and a bottom surface, in a process chamber;
    depositing an amorphous silicon film over the substrate having one or more features;
    annealing the deposited amorphous silicon film to heal one or more seams formed in the one or more features; and
    etching a portion of the annealed amorphous silicon film to remove one or more voids formed in the annealed amorphous silicon film in the one or more features.

2. The method of claim 1, wherein the one or more features are trenches having an aspect ratio greater than or equal to about 5:1.

3. The method of claim 1, wherein the depositing an amorphous silicon film comprises exposing the substrate to a silicon precursor.

4. The method of claim 3, wherein the silicon precursor is selected from the group consisting of silane, disilane, dichlorosilane, trisilane, and tetrasilane.

5. The method of claim 3, further comprising:
    exposing the substrate to a boron, phosphorous, gallium, tin, arsenic, germanium, carbon, nitrogen, antimony or indium precursor.

6. The method of claim 1, wherein the depositing an amorphous silicon film occurs at a temperature between about 150 degrees Celsius and about 500 degrees Celsius and at a pressure between about 100 mTorr and about 350 Torr.

7. The method of claim 1, wherein the annealing the deposited amorphous silicon film occurs at a temperature between about 400 degrees Celsius and about 1,100 degrees Celsius and at a pressure between about 100 mTorr and about 1 atm.

8. The method of claim 1, wherein the etching a portion of the annealed amorphous silicon film comprises exposing the amorphous silicon film to an etchant comprising one or more of $NF_3$, $Cl_2$, HCl, HBr, $C_4F_6$, $C_2F_4$, $H_2$, Ar, He, and $N_2$.

9. The method of claim 8, wherein the etching the portion of the annealed amorphous silicon film further comprises recessing the annealed amorphous silicon film a distance below a top surface of the substrate, the distance being equal to a distance between the top surface of the substrate and a bottom of the lowermost of the one or more voids in the one or more features.

10. A method for manufacturing a semiconductor device, comprising:
    positioning a substrate having one or more high aspect ratio trenches formed in a surface thereof, each of the one or more high aspect ratio trenches having sidewalls and a bottom surface, in a process chamber;

depositing an amorphous silicon film in the one or more high aspect ratio trenches;

annealing the deposited amorphous silicon film to heal one or more seams formed in the one or more high aspect ratio trenches; and etching the annealed amorphous silicon film to a distance below a top surface of the substrate, the distance being equal to a distance between the top surface of the substrate and a bottom of the lowermost of one or more voids in the one or more high aspect ratio trenches.

11. The method of claim 10, wherein the amorphous silicon film is doped.

12. The method of claim 11, wherein the depositing an amorphous silicon film comprises:

exposing the substrate to a silicon precursor; and exposing the substrate to a boron, phosphorous, gallium, tin, arsenic, germanium, carbon, nitrogen, antimony or indium precursor.

13. The method of claim 12, wherein the depositing an amorphous silicon film occurs at a temperature between about 150 degrees Celsius and about 500 degrees Celsius and at a pressure between about 100 mTorr and about 350 Torr.

14. The method of claim 13, wherein the annealing an amorphous silicon film occurs at a temperature between about 400 degrees Celsius and about 1,100 degrees Celsius and at a pressure between about 100 mTorr and about 1 atm.

15. The method of claim 14, wherein the etching a portion of the annealed amorphous silicon film comprises exposing the amorphous silicon film to an etchant comprising one or more of $NF_3$, $Cl_2$, HCl, HBr, $C_4F_6$, $C_2F_4$, $H_2$, Ar, He, and $N_2$.

16. A method for manufacturing a semiconductor device, comprising:

positioning a substrate having one or more features formed in a surface of the substrate, each of the one or more features having sidewalls and a bottom surface, in a first chamber;

depositing a material over the substrate having one or more features in the first chamber;

annealing the material in the first chamber to heal one or more seams in the material;

transferring the substrate having one or more features to a second chamber; and etching a portion of the annealed material to remove one or more voids in the annealed material.

17. The method of claim 16, wherein the material is amorphous silicon.

18. The method of claim 16, wherein the depositing a material occurs at a temperature between about 150 degrees Celsius and about 500 degrees Celsius and at a pressure between about 100 mTorr and about 350 Torr.

19. The method of claim 18, wherein the annealing the material occurs at a temperature between about 400 degrees Celsius and about 1,100 degrees Celsius and at a pressure between about 100 mTorr and about 1 atm.

20. The method of claim 19, wherein the etching a portion of the annealed material comprises recessing the annealed material a distance below a top surface of the substrate, the distance being equal to a distance between the top surface of the substrate and a bottom of the lowermost of the one or more voids in the one or more features.

* * * * *